US008921856B2

(12) United States Patent
Tang et al.

(10) Patent No.: US 8,921,856 B2
(45) Date of Patent: Dec. 30, 2014

(54) TFT-PIN ARRAY SUBSTRATE AND ASSEMBLY STRUCTURE FOR FLAT-PANEL X-RAY DETECTOR

(71) Applicant: National Chiao Tung University, Hsinchu (TW)

(72) Inventors: Pao-Yun Tang, Taoyuan County (TW); Shu-Lin Ho, Taoyuan County (TW); Kei-Hsiung Yang, Taoyuan County (TW)

(73) Assignee: National Chiao Tung University, Hsinchu (TW)

( * ) Notice: Subject to any disclaimer, the term of this patent is extended or adjusted under 35 U.S.C. 154(b) by 78 days.

(21) Appl. No.: 13/875,446

(22) Filed: May 2, 2013

(65) Prior Publication Data

US 2014/0284605 A1    Sep. 25, 2014

(30) Foreign Application Priority Data

Mar. 19, 2013 (TW) .............................. 102109664 A

(51) Int. Cl.
*H01L 29/04*   (2006.01)
*H01L 31/115*  (2006.01)
*H01L 31/0376* (2006.01)

(52) U.S. Cl.
CPC ........ *H01L 31/115* (2013.01); *H01L 31/03762* (2013.01)

USPC 257/53; 257/290; 257/E31.001; 257/E31.047

(58) Field of Classification Search
CPC ................... H01L 27/14643; H01L 27/14609; H01L 27/14689; H01L 27/14603; H01L 27/14641
USPC ...................... 257/53, 290, E31.001, E31.047
See application file for complete search history.

(56) References Cited

U.S. PATENT DOCUMENTS

| | | | |
|---|---|---|---|
| 2011/0114847 A1 | 5/2011 | Fujieda et al. | |
| 2011/0147741 A1 | 6/2011 | Jung et al. | |
| 2012/0168759 A1 | 7/2012 | Lee | |
| 2013/0125960 A1* | 5/2013 | Yang et al. | 136/252 |
| 2014/0231804 A1* | 8/2014 | Yan et al. | 257/53 |

* cited by examiner

*Primary Examiner* — Andy Huynh
(74) *Attorney, Agent, or Firm* — Rosenberg, Klein & Lee

(57) ABSTRACT

A TFT-PIN array substrate and an assembly structure for a flat-panel x-ray detector are provided to overcome the problem that the conventional scintillator substrate and TFT-PIN array substrate are neither penetrated by UV-light nor assembled by UV curable LOCA. The metal layer of the PIN photodiode of the TFT-PIN array substrate is perforated to have at least one hole, whereby UV-light can pass through the TFT-PIN array substrate to cure UV curable LOCA. Therefore, UV curable LOCA can be used as an adhesive layer in the assembly structure of a scintillator substrate and a TFT-PIN array substrate to promote the detective quantum efficiency and image quality of a flat-panel X-Ray detector.

22 Claims, 9 Drawing Sheets

TFT-PIN ARRAY SUBSTRATE AND ASSEMBLY STRUCTURE FOR FLAT-PANEL X-RAY DETECTOR

BACKGROUND OF THE INVENTION

1. Field of the Invention

The present invention relates to a flat-panel X-ray detector, particularly to a TFT-PIN array substrate and an assembly structure for a flat-panel X-ray detector, which are suitable to a UV curable liquid optically clear adhesive (LOCA) process.

2. Description of the Related Art

FPXD (Flat-Panel X-ray Detector) is an important element in the digital medical image technology. FPXD, with a larger field of detection area and higher detective quantum efficiency (DQE), provides excellent image quality of radiography and simplifies the work flow of diagnostic. TFT-FPXD comprises a scintillator substrate and a TFT-PIN array substrate. The TFT-PIN substrate further comprises a TFT (Thin Film Transistor) and a PIN (Positive-Intrinsic-Negative) photodiode. There are various types of scintillators, but the CsI:Tl (Tl-doped CsI) scintillator is a frequently-used one. CsI:Tl is deposited on an aluminum substrate or a graphite-fiber substrate by a thermal evaporator. The crystal of CsI:Tl has a polycrystalline structure or a column structure. The polycrystalline structure has an advantage of simple fabrication parameters and a disadvantage of severe image blur caused by a larger scatter angle. An X-ray beam excites a scintillator to emit visible light. A larger scatter angle of the visible light emitted by the scintillator may cause the neighboring pixels to operate falsely, decrease the spatial resolution, and lower the detective quantum efficiency. The column structure has disadvantages of complicated fabrication parameters of single crystal and low stability of the yield, especially in a large-area FPXD. However, the column structure has an advantage of a smaller scatter angle, which can decrease noise and increase image resolution.

Below are introduced the conventional assembly structures of a scintillator substrate and a TFT-PIN array substrate. Refer to FIG. 1. PSA (Pressure Sensitive Adhesive) 400 is arranged between a scintillator substrate 410 and a TFT-PIN array substrate 420, and they are assembled together via pressing them. The PSA-based assembly method is more suitable to assemble a scintillator 412 having a flexible substrate 411 to the TFT-PIN array substrate 420. Refer to FIG. 2. Ambient temperature-humidity cured or thermoset LOCA (Liquid Optically Clear Adhesive) 430 is arranged between a scintillator substrate 410 and a TFT-PIN array substrate 420, and they are assembled together via pressing them. The LOCA-based assembly method is more suitable to assemble a scintillator 412 having a rigid substrate 411, which is made of a hard material (such as aluminum or graphite fiber), to the TFT-PIN array substrate 420. The LOCA-based assembly method has a disadvantage of long curing time, which to likely to affect yield and alignment precision. Refer to FIG. 3. There is also an assembly method, wherein external pressure is applied to fix a scintillator substrate 410 and a TFT-PIN array substrate 420. However, the method is likely to generate gaps between the scintillator substrate 410 and the TFT-PIN array substrate 420. The difference between the refractivities of the air in the gaps and the scintillator 412 would decrease light transmittance and thus causes variation of light transmittance and unevenness of brightness.

Refer to FIG. 5A and FIG. 6 respectively a diagram showing a conventional TFT-PIN array substrate and a sectional view taken along Section Line A-A in FIG. 5A. The PIN photodiode 423 of the TFT-PIN array substrate 420 includes a metal layer 431, a photoelectric conduction layer 433, a transparent conduction layer 434, and a common wiring 460. The common wiring 460 is electrically connected with the transparent conduction layer 434 of the PIN photodiode 423 through a contact hole 451. The conventional PIN photodiode 423 of the TFT-PIN array substrate 420 has a metal layer 431 spread on the whole surface. Thus, the long-wavelength ultraviolet ray having a wavelength of 365 nm (UVA) cannot penetrate metal layer 431. Consequently, UV curable LOCA is hard to cure in the conventional PIN photodiode 423 of the TFT-PIN array substrate 420. Therefore, UV curable LOCA cannot apply to the fabrication of the conventional assembly structure of flat-panel X-ray detectors.

SUMMARY OF THE INVENTION

The primary objective of the present invention is to provide a TFT-PIN array substrate and an assembly structure for a flat-panel X-ray detector, wherein the metal layer of the PIN photodiode of the TFT-PIN array substrate is perforated to have a hole allowing UV-light to pass through the TFT-PIN array substrate, whereby UV curable LOCA can be cured by UV-light, and whereby UV curable LOCA can be applied to assemble the scintillator substrate and the TFT-PIN array substrate, and whereby is increased the detective quantum efficiency and promoted the quality of medical X-ray images.

To achieve the abovementioned objective, the present invention proposes a TFT-PIN array substrate for a flat-panel X-ray detector, which comprises a first substrate; a TFT and a PIN photodiode formed on the first substrate. The PIN photodiode includes a metal layer, a photoelectric conduction layer, and a first transparent conduction layer. The photoelectric conduction layer is formed on the metal layer and excited by external light to generate electrons and holes. The first transparent conduction layer is formed on the photoelectric conduction layer. The metal layer is perforated to have at least one hole, which allows external light to pass through the metal layer.

The present invention also proposes an assembly structure for a flat-panel X-ray detector, which comprises a scintillator substrate; an adhesive layer made of UV curable LOCA and formed on the scintillator; and a TFT-PIN array substrate stuck to the scintillator substrate by the adhesive layer. The TFT-PIN array substrate includes a first substrate; a TFT and a PIN photodiode formed on the first substrate. The PIN photodiode includes a metal layer, a photoelectric conduction layer, and a first transparent conduction layer. The photoelectric conduction layer is formed on the metal layer and excited by external light to generate electrons and holes. The first transparent conduction layer is formed on the photoelectric conduction layer. The metal layer is perforated to have at least one hole, which allows external light (UV-light) to pass through and cure UV curable LOCA, whereby the scintillator substrate and the TFT-PIN array substrate are assembled together. The UV curable LOCA has a viscosity of about 2000-3000 CPS.

The photoelectric conduction layer of the PIN photodiode includes an n-type doped amorphous silicon layer; an undoped intrinsic amorphous silicon layer; and a p-type doped amorphous silicon layer. The first transparent conduction layer is made of a transparent electric conduction material, such as ITO (Indium Tin Oxide) or IZO (Indium Zinc Oxide). In one embodiment, the PIN photodiode further includes a second transparent conduction layer, which is arranged between the metal layer and the photoelectric conduction layer to increase the capacitance of the PIN photodiode.

In the assembly structure for a flat-panel X-ray detector, TFT includes a gate wiring, a gate insulation layer, a semiconductor island, a data transmission wiring, a dielectric layer and a common wiring. The gate wiring is formed on the first substrate and includes a gate line and a gate electrically connected with the gate line. The gate insulation layer covers the gate wiring and the first substrate. The semiconductor island is formed on the gate insulation layer and exactly above the gate. The data transmission wiring is formed on the gate insulation layer and includes a data line, a source and a drain. The data line intersects the gate line. The source and the drain are extended to the semiconductor island and separated in said semiconductor island. The drain electrically connects with the data line. The source electrically connects with the metal layer of the PIN photodiode. The dielectric layer covers the data transmission wiring and the PIN photodiode and includes one or more contact holes. The common wiring is formed on the dielectric layer and electrically connected with the first transparent conduction layer of the PIN photodiode through the contact hole.

Below, embodiments are described in detail in cooperation with drawings to make easily understood the objectives, characteristics and accomplishments of the present invention.

DETAILED DESCRIPTION OF THE INVENTION

Figure 1:
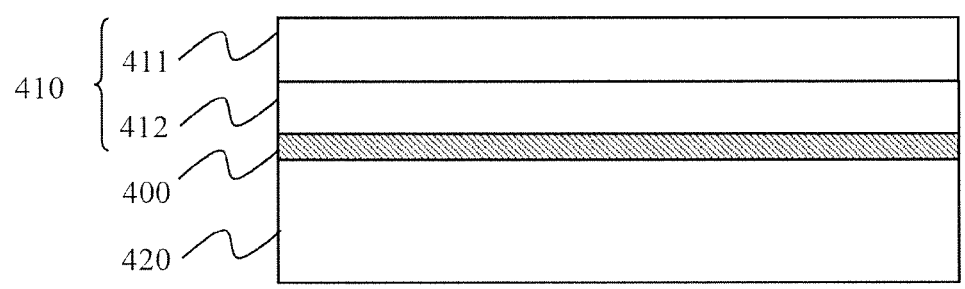
FIGS. 1-3 are diagrams schematically conventional assembly structures for a flat-panel X-ray detector.
Figure 2:
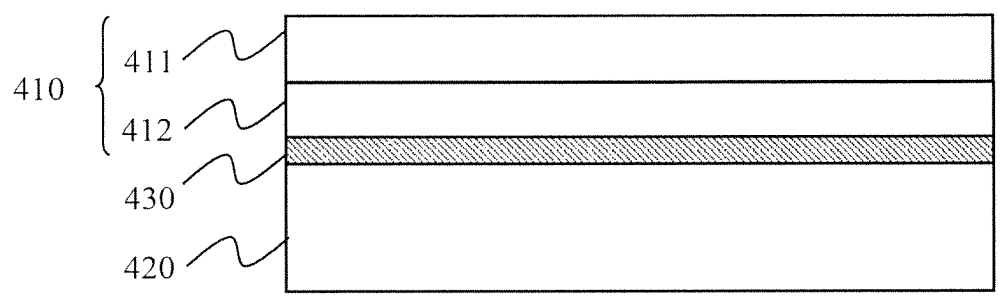
Figure 3:
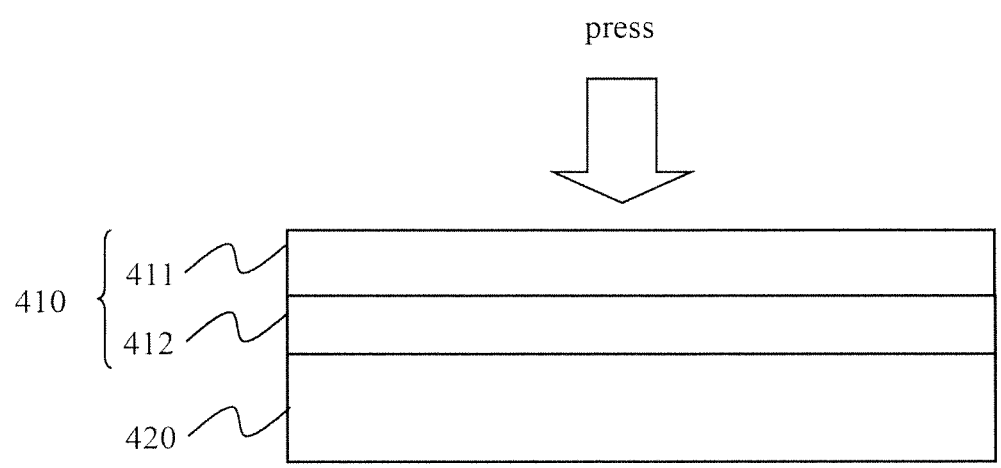
Figure 4:
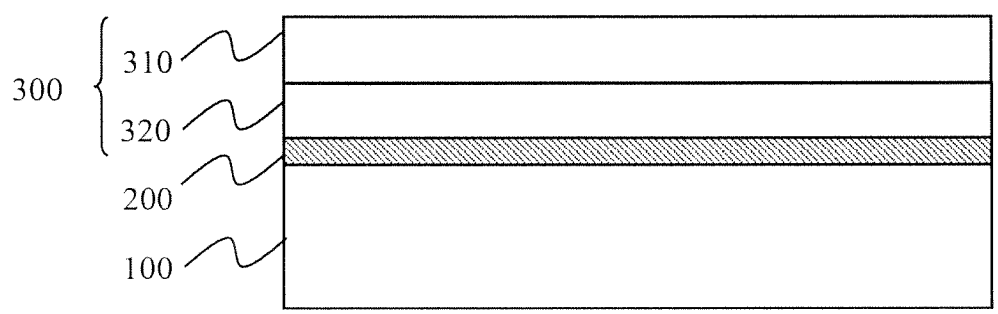
FIG. 4 is a diagram schematically showing an assembly structure for a flat-panel X-ray detector according to one embodiment of the present invention.

The present invention proposes a TFT-PIN array substrate and an assembly structure for a flat-panel X-ray detector, which are suitable to a UV curable LOCA-based process. Refer to FIG. 4 a diagram schematically showing an assembly structure for a flat-panel X-ray detector according to one embodiment of the present invention. The assembly structure of the present invention comprises a TFT-PIN array substrate 100, an adhesive layer 200, and a scintillator substrate 300. The TFT-PIN array substrate 100 includes a first substrate; a TFT and a PIN photodiode formed on the first substrate, which will be described in detail thereinafter. The scintillator substrate 300 includes a second substrate 310 and a scintillator 320 formed on the second substrate 310. The TFT-PIN array substrate 100 is faced to the scintillator 320 of the scintillator substrate 300 and stuck to the scintillator substrate 300 by the adhesive layer 200, which is made of UV curable LOCA and formed between the TFT-PIN array substrate 100 and the scintillator substrate 300. The UV curable LOCA has a viscosity of about 2000-3000 CPS.

In the conventional technology, UV-light is unlikely to pass through the scintillator substrate and the TFT-PIN array substrate to cure UV curable LOCA. Therefore, the conventional technology cannot assemble the scintillator substrate and the TFT-PIN array substrate with a UV curable LOCA-based method. In the present invention, the metal layer of the PIN photodiode of the TFT-PIN array substrate 100 is perforated to allow UV-light to pass through the TFT-PIN array substrate 100. Therefore, UV curable LOCA can be cured by UV-light to assemble the scintillator substrate and the TFT-PIN array substrate in the present invention. Below, embodiments are used to demonstrate the structure and principle of the TFT-PIN array substrate 100.

Figure 5A:
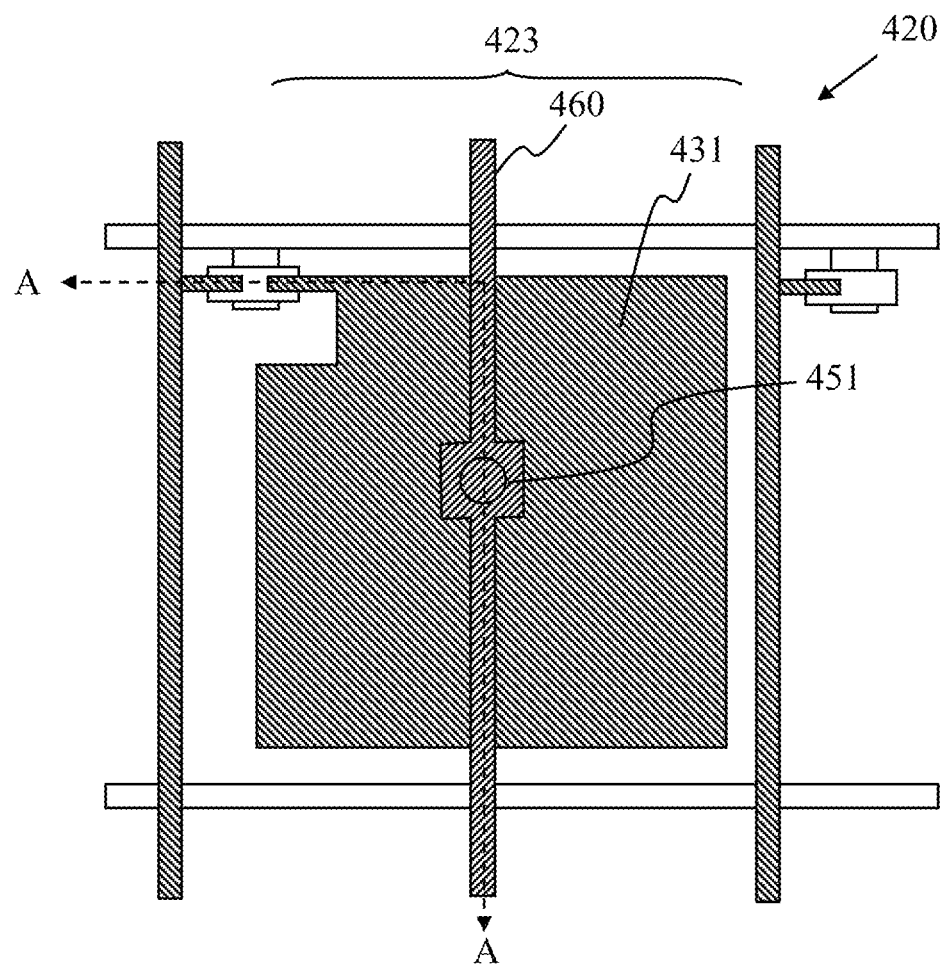
FIG. 5A is a diagram showing a conventional TFT-PIN array substrate with Section Line A-A thereon.
Figure 5B:
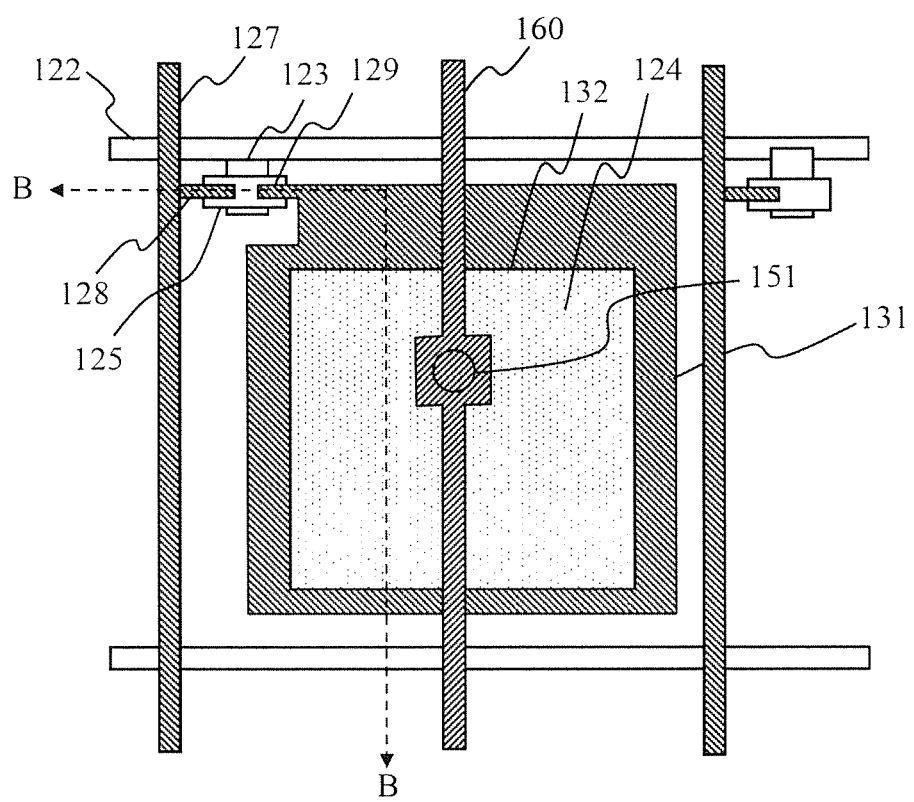
FIG. 5B is a diagram schematically showing a TFT-PIN array substrate with Section Line B-B thereon according to one embodiment of the present invention.
Figure 6:
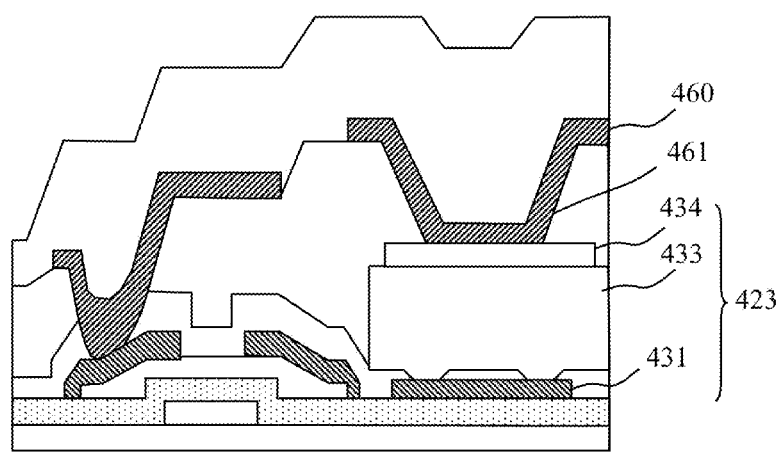
FIG. 6 is a sectional view taken along Section Line A-A in FIG. 5A.
Figure 7:
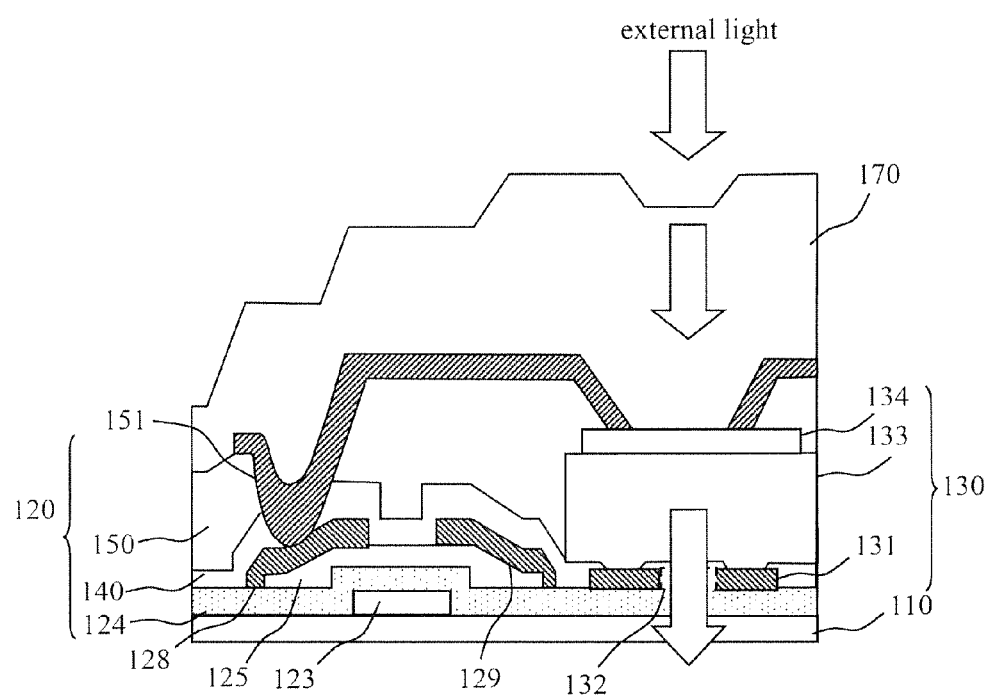
FIG. 7 is a sectional view taken along Section Line B-B in FIG. 5B.

Refer to FIG. 5B a diagram schematically showing a TFT-PIN array substrate 100 with Section Line B-B thereon according to one embodiment of the present invention. Also refer to FIG. 7 a sectional view taken along Section Line B-B in FIG. 5B.

A gate wiring is made of a metallic material and formed on TFT 120 disposed on a first substrate 110. The gate wiring includes a gate line 122 extending transversely and a gate 123 electrically connecting with the gate line 122. A gate insulation layer 124 covers the gate wiring and the first substrate 110. A semiconductor island 125 is formed on the gate insulation layer and exactly above the gate 123. A data transmission wiring is made of a metallic material and formed on the gate insulation layer 124. The data transmission wiring includes a data line 127 extending longitudinally and intersecting the gate line 122, a drain 128 extending to the semiconductor island 125, and a source 129 also extending to the semiconductor island 125. The drain 128 and the source 129 are separated in the semiconductor island 125. The drain 128 electrically connects with the data line 127. The source 129 electrically connects with a metal layer 131, which is within the coverage of a PIN photodiode 130. The metal layer 131 is perforated to have a single hole 132, which penetrates the metal layer 131 and reveals the gate insulation layer 124 below the metal layer 131. However, the present invention does not limit the number of the holes 132.

A photoelectric conduction layer 133 is formed on the metal layer 131 and excited by external light to generate electrons and holes. The photoelectric conduction layer 133 includes an n-type doped amorphous silicon layer; an undoped intrinsic amorphous silicon layer; and a p-type doped amorphous silicon layer. A first transparent conduction layer 134 is formed on the photoelectric conduction layer 133 and made of a transparent electric conduction material, such as ITO (Indium Tin Oxide) or IZO (Indium Zinc Oxide). The metal layer 131, photoelectric conduction layer 133 and first transparent conduction layer 134 jointly form the PIN photodiode 130.

A passivation layer 140 covers the data transmission wiring and the metal layer 131. A dielectric layer 150 covers the PIN photodiode 130, the passivation layer 140, and the data transmission wiring and that is below the passivation layer 140. A plurality of contact holes 151 penetrates the passivation layer 140 and the dielectric layer 150 to reveal the source 129 and the surface of the first transparent conduction layer 133. A common wiring 160 is made of a metallic material, formed on the dielectric layer 150, and extended longitudinally. The common wiring 160 is electrically connected with the first transparent conduction layer 140 of the PIN photodiode 130 through the contact hole 151, as shown in FIG. 5B. A nitride barrier layer 170 is formed over the TFT 120 and the PIN photodiode 130.

Refer to FIG. 7 again for an assembly structure for a flat-panel X-ray detector according to the abovementioned embodiment. Via the design of perforating a hole 132 in the PIN photodiode 130 of the TFT-PIN array substrate 100, external light (especially UVA having a wavelength of 365 nm) is allowed to pass through the TFT-PIN array substrate 100 to cure the adhesive layer 200 made of UV curable LOCA. Therefore, the present invention can assembly the TFT-PIN array substrate 100 and the scintillator substrate 300 in a UV curable LOCA-based method.

Figure 8:
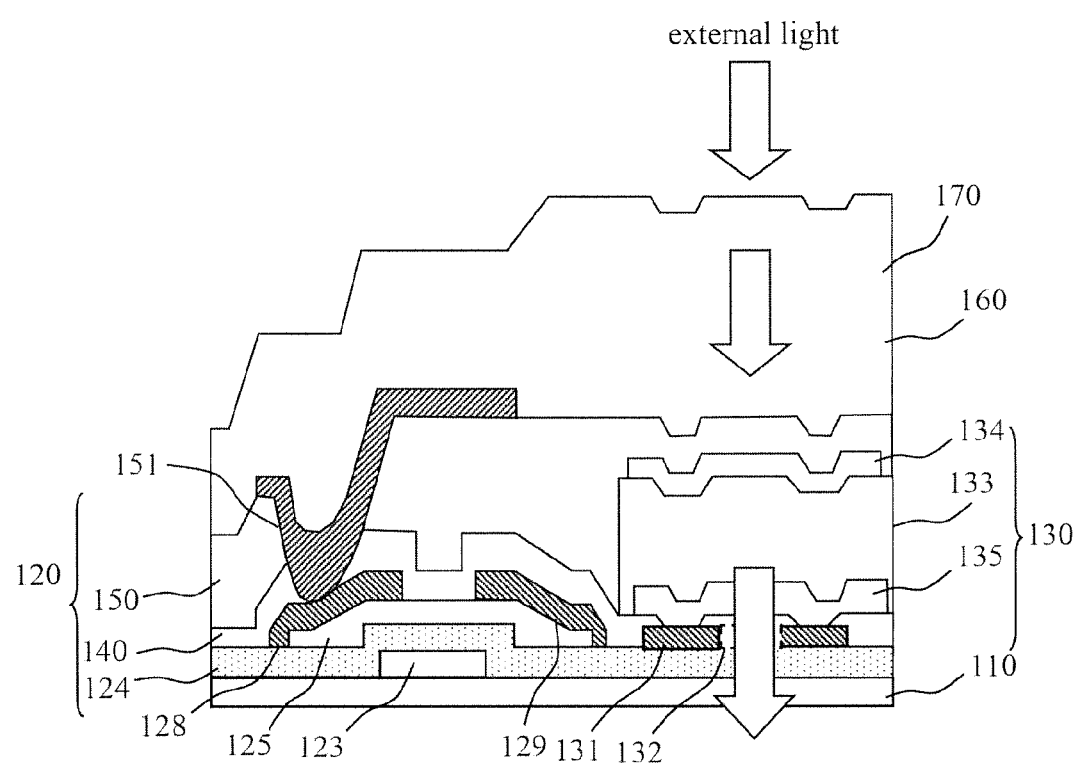
FIG. 8 is a sectional view schematically showing a TFT-PIN array substrate for a flat-panel X-ray detector according to another embodiment of the present invention.

Refer to FIG. 8 a sectional view schematically showing a TFT-PIN array substrate 100 for a flat-panel X-ray detector according to another embodiment of the present invention. In this embodiment, the PIN photodiode 130 further comprises a second transparent conduction layer 135 in addition to the metal layer 131, photoelectric conduction layer 133 and first transparent conduction layer 134. The second transparent conduction layer 135 is formed between the metal layer 131 and the photoelectric conduction layer 133. The second transparent conduction layer 135 is made of a transparent electric conduction material, such as ITO (Indium Tin Oxide) or IZO (Indium Zinc Oxide). The second transparent conduction layer 135 can increase the capacitance of the PIN photodiode 130, maintaining the quantity of the stored charges. The hole 132 perforated in the metal layer 131 can increase the transmittance of UV-light.

In conclusion, the present invention discloses a TFT-PIN array substrate and an assembly structure for a flat-panel X-ray detector, wherein holes are perforated in the metal layers of the PIN photodiode of the TFT-PIN array substrate to exempt UV-light from being blocked by the metal layer and allow UV-light to pass through the TFT-PIN array substrate to cure UV curable LOCA. Thereby, the adhesive layer made of UV curable LOCA can be used to assemble the TFT-PIN array substrate and the scintillator substrate. Further, the present invention can also increase the detective quantum efficiency and promote the quality of medical X-ray images.

The embodiments described above are only to exemplify the present invention but not to limit the scope of the present invention. Any equivalent modification or variation according to the spirit of the present invention is to be also included within the scope of the present invention, which is based on the claims stated below.

What is claimed is:

1. A TFT-PIN array substrate for a flat-panel X-Ray detector, comprising
   a first substrate; and
   a thin film transistor (TFT) and a positive-intrinsic-negative (PIN) photodiode formed on said first substrate, wherein said PIN photodiode includes a metal layer, a photoelectric conduction layer and a first transparent conduction layer, and wherein said photoelectric conduction layer is formed on said metal layer and excited by external light to generate electrons and holes, and wherein said first transparent conduction layer is formed on said photoelectric conduction layer, and wherein said metal layer is perforated to have at least one hole allowing external light to pass through.

2. The TFT-PIN array substrate according to claim 1, wherein said photoelectric conduction layer includes an n-type doped amorphous silicon layer, an undoped intrinsic amorphous silicon layer, and a p-type doped amorphous silicon layer.

3. The TFT-PIN array substrate according to claim 1, wherein said first transparent conduction layer is made of a transparent electric conduction material selected from a group consisting of ITO (Indium Tin Oxide) and IZO (Indium Zinc Oxide).

4. The TFT-PIN array substrate according to claim 1, wherein said PIN photodiode further includes a second transparent conduction layer formed between said metal layer and said photoelectric conduction layer to increase capacitance of said PIN photodiode.

5. The TFT-PIN array substrate according to claim 4, wherein said second transparent conduction layer is made of a transparent electric conduction material selected from a group consisting of ITO (Indium Tin Oxide) and IZO (Indium Zinc Oxide).

6. The TFT-PIN array substrate according to claim 1, wherein said TFT includes
   a gate wiring formed on said first substrate and having a gate line and a gate electrically connected with said gate line;
   a gate insulation layer covering said gate wiring and said first substrate;
   a semiconductor island formed on said gate insulation layer and exactly above said gate;
   a data transmission wiring formed on said gate insulation layer and including a data line, a source and a drain, wherein said data line intersects said gate line, and wherein said source and said drain are extended to said semiconductor island and separated in said semiconductor island, and wherein said drain electrically connects with said data line, and wherein said source electrically connects with said metal layer of said PIN photodiode; and
   a dielectric layer covering said data transmission wiring and said PIN photodiode and including at least one contact hole; and
   a common wiring formed on said dielectric layer and electrically connected with said first transparent conduction layer of said PIN photodiode through said contact hole.

7. The TFT-PIN array substrate according to claim 6, wherein said dielectric layer includes a plurality of contact holes penetrating said dielectric layer and respectively revealing surface of said gate and surface of said first transparent conduction layer.

8. The TFT-PIN array substrate according to claim 6, wherein said TFT further includes a passivation layer covering said data transmission wiring and said metal layer, and wherein said dielectric layer covers said passivation layer, and wherein said contact holes penetrate said passivation layer and said dielectric layer.

9. The TFT-PIN array substrate according to claim 6 further comprising a nitride barrier layer formed over said TFT and said PIN photodiode.

10. The TFT-PIN array substrate according to claim 6, wherein said hole penetrates said metal layer and reveals said gate insulation layer below said metal layer.

11. An assembly structure for a flat-panel X-Ray detector, comprising
    a scintillator substrate;
    an adhesive layer made of a UV (ultraviolet) curable LOCA (Liquid Optically Clear Adhesive) and formed on said scintillator substrate; and
    a TFT-PIN array substrate stuck to said scintillator substrate by said adhesive layer and further comprising a first substrate, and a thin film transistor (TFT) and a positive-intrinsic-negative (PIN) photodiode formed on said first substrate, wherein said PIN photodiode includes a metal layer, a photoelectric conduction layer and a first transparent conduction layer, and wherein said photoelectric conduction layer is formed on said metal layer and excited by external light to generate electrons and holes, and wherein said first transparent conduction layer is formed on said photoelectric conduction layer, and wherein said metal layer is perforated to have at least one hole allowing external light to pass through to cure said UV curable LOCA and assemble said scintillator substrate and said TFT-PIN array substrate together.

12. The assembly structure for a flat-panel X-Ray detector according to claim 11, wherein said scintillator substrate includes a second substrate and a scintillator, and wherein said scintillator is arranged on said second substrate and faced to said TFT-PIN array substrate.

13. The assembly structure for a flat-panel X-Ray detector according to claim 11, wherein said photoelectric conduction layer includes an n-type doped amorphous silicon layer, an undoped intrinsic amorphous silicon layer, and a p-type doped amorphous silicon layer.

14. The assembly structure for a flat-panel X-Ray detector according to claim 11, wherein said first transparent conduction layer is made of a transparent electric conduction material selected from a group consisting of ITO (Indium Tin Oxide) and IZO (Indium Zinc Oxide).

15. The assembly structure for a flat-panel X-Ray detector according to claim 11, wherein said PIN photodiode further includes a second transparent conduction layer formed between said metal layer and said photoelectric conduction layer to increase capacitance of said PIN photodiode.

16. The assembly structure for a flat-panel X-Ray detector according to claim 15, wherein said second transparent conduction layer is made of a transparent electric conduction material selected from a group consisting of ITO (Indium Tin Oxide) and IZO (Indium Zinc Oxide).

17. The assembly structure for a flat-panel X-Ray detector according to claim 11, wherein said TFT includes
 a gate wiring formed on said first substrate and having a gate line and a gate electrically connected with said gate line;
 a gate insulation layer covering said gate wiring and said first substrate;
 a semiconductor island formed on said gate insulation layer and exactly above said gate;
 a data transmission wiring formed on said gate insulation layer and including a data line, a source and a drain, wherein said data line intersects said gate line, and wherein said source and said drain are extended to said semiconductor island and separated in said semiconductor island, and wherein said drain electrically connects with said data line, and wherein said source electrically connects with said metal layer of said PIN photodiode; and
 a dielectric layer covering said data transmission wiring and said PIN photodiode and including at least one contact hole; and
 a common wiring formed on said dielectric layer and electrically connected with said first transparent conduction layer of said PIN photodiode through said contact hole.

18. The assembly structure for a flat-panel X-Ray detector according to claim 17, wherein said dielectric layer includes a plurality of contact holes penetrating said dielectric layer and respectively revealing surface of said gate and surface of said first transparent conduction layer.

19. The assembly structure for a flat-panel X-Ray detector according to claim 17, wherein said TFT further includes a passivation layer covering said data transmission wiring and said metal layer, and wherein said dielectric layer covers said passivation layer, and wherein said contact holes penetrate said passivation layer and said dielectric layer.

20. The assembly structure for a flat-panel X-Ray detector according to claim 17, further comprising a nitride barrier layer formed over said TFT and said PIN photodiode.

21. The assembly structure for a flat-panel X-Ray detector according to claim 17, wherein said hole penetrates said metal layer and reveals said gate insulation layer below said metal layer.

22. The assembly structure for a flat-panel X-Ray detector according to claim 11, wherein said UV curable LOCA has a viscosity of 2000-3000 CPS.

* * * * *